United States Patent
Li et al.

(10) Patent No.: US 11,073,570 B1
(45) Date of Patent: Jul. 27, 2021

(54) DETECTING PROBLEMATIC VOLTAGE SIGNALS FROM CHARGE PUMPS

(71) Applicant: Western Digital Technologies, Inc., San Jose, CA (US)

(72) Inventors: Liang Li, Shanghai (CN); Hui Jia, Shanghai (CN); Qin Zhen, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/885,655

(22) Filed: May 28, 2020

(51) Int. Cl.
*G01R 31/40* (2020.01)

(52) U.S. Cl.
CPC ..................... *G01R 31/40* (2013.01)

(58) Field of Classification Search
CPC ........................................... G01R 31/40
USPC ....................... 324/64.01, 537, 500
See application file for complete search history.

(56) References Cited

U.S. PATENT DOCUMENTS

| | | | |
|---|---|---|---|
| 6,549,198 B1 * | 4/2003 | Uto ..................... | G09G 1/167 345/204 |
| 9,318,209 B1 | 4/2016 | Huynh et al. | |
| 9,810,723 B2 | 11/2017 | Pan et al. | |
| 2004/0164811 A1 * | 8/2004 | Kawasumi .............. | H03L 7/187 331/16 |
| 2009/0278525 A1 | 11/2009 | Mathias et al. | |
| 2016/0026202 A1 | 1/2016 | Venkataraman et al. | |
| 2017/0070338 A1 | 3/2017 | Giriyappa et al. | |
| 2017/0153296 A1 | 6/2017 | Engl et al. | |
| 2019/0252890 A1 * | 8/2019 | Chen ..................... | H02J 7/008 |
| 2020/0005692 A1 * | 1/2020 | Hu ........................ | G09G 3/3291 |
| 2020/0303941 A1 * | 9/2020 | Inoue .................... | H02M 3/137 |

FOREIGN PATENT DOCUMENTS

| | | |
|---|---|---|
| JP | 2004248475 A | 9/2004 |
| SU | 1721831 A1 | 3/1992 |

OTHER PUBLICATIONS

International Search Report & Written Opinion of the International Searching Authority dated Jun. 23, 2021, International Application No. PCT/US2021/016667.
English translation of Japanese Publication No. JP2004248475 dated Sep. 2, 2004.

* cited by examiner

*Primary Examiner* — Giovanni Astacio-Oquendo
(74) *Attorney, Agent, or Firm* — Vierra Magen Marcus LLP

(57) ABSTRACT

Techniques and apparatuses are provided for testing a charge pump. A test circuit detects voltage drop-offs in a voltage signal provided by a charge pump in a test period. A comparator is used to compare the voltage signal to a divided down, delayed version of the signal. A counting circuit is connected to an output of the comparator to determine a number of the drop-offs in the test period. A control circuit such as an on-chip state machine compares the number of drop-offs to a maximum allowable number of drop-offs to set a pass/fail status of the charge pump. The control circuit can configure various parameters of the test, including a ratio of a voltage divider, and the maximum allowable number of drop-offs based on the charge pump being tested.

20 Claims, 14 Drawing Sheets

Fig. 6A

| Address 0xh | | | Charge pump |
|---|---|---|---|
| 0 | 0 | 0 | A |
| 0 | 0 | 1 | B |
| 0 | 1 | 0 | C |
| 0 | 1 | 1 | D |
| 1 | 0 | 0 | E |
| 1 | 0 | 1 | F |
| 1 | 1 | 0 | G |
| 1 | 1 | 1 | H |

Fig. 6B

| Address xxh | | | Ratio | Guard band (V) Vpath1=10 V |
|---|---|---|---|---|
| 0 | 0 | 0 | 0.98 | 0.2 |
| 0 | 0 | 1 | 0.96 | 0.4 |
| 0 | 1 | 0 | 0.94 | 0.6 |
| 0 | 1 | 1 | 0.92 | 0.8 |
| 1 | 0 | 0 | 0.90 | 1.0 |

Fig. 6C

| Address yyh | | | Max. allowable number of drop-offs |
|---|---|---|---|
| 0 | 0 | 0 | 1 |
| 0 | 0 | 1 | 2 |
| 0 | 1 | 0 | 4 |
| 0 | 1 | 1 | 6 |
| 1 | 0 | 0 | 8 |

Fig. 6D

| Charge pump | Ratio | Max. allowable number of drop-offs |
|---|---|---|
| A | 0.98 | 1 |
| B | 0.92 | 4 |
| C | 0.96 | 2 |

DETECTING PROBLEMATIC VOLTAGE SIGNALS FROM CHARGE PUMPS

BACKGROUND

The present technology relates to charge pumps.

Electronic devices often require regulated voltages in order to operate properly. Typically, a supply voltage of the device is provided to a voltage regulator which can translate the voltage to an output voltage at different levels. Various types of voltage regulators can be used. For example, a charge pump, or voltage converter, provides an output voltage which is different from the supply voltage. A charge pump typically uses capacitors as energy storage elements to provide an output voltage which is higher or lower than the input voltage. Moreover, a charge pump can include voltage regulation circuitry to maintain the output voltage at a constant level.

BRIEF DESCRIPTION OF THE DRAWINGS

FIG. 6A is a table for use in connection with step 512 of FIG. 5B which cross-references different charge pumps to different addresses.

FIG. 6B is a table for use in connection with step 515 of FIG. 5B which cross-references different guard bands to different addresses.

FIG. 6C is a table for use in connection with step 517 of FIG. 5B which cross-references different maximum allowable numbers of drop-offs to different addresses.

FIG. 6D is a table for use in connection with step 517 of FIG. 5B which cross-references charge pumps to a different guard band ratios and maximum allowable numbers of drop-offs.

FIG. 7A depicts an example implementation of the charge pump 301 of FIG. 3A configured as a single-stage charge pump 301a.

DETAILED DESCRIPTION

Apparatus and techniques are provided for detecting problematic voltage signals from charge pumps on an integrated circuit or chip.

Charge pumps are used in integrated circuits to provide voltages at specified levels to components of the circuit. A charge pump generally refers to a switching voltage converter that converts an input voltage to a different output voltage. A charge pump includes a storage element such as a capacitor to repeatedly transfer charge from an input node to an output node according to a clock signal. The clock signal is used to control the timing of the opening and closing of switches which transfer the charge. A feedback mechanism may be used to regulate the output voltage at a specified level by alternately blocking the clock signal from reaching the charge pump and allowing the clock signal to reach the charge pump.

Charge pumps play an important role in integrated circuits. For example, in a memory device, charge pumps can be used to provide voltage signals for erase, program and read operations. Moreover, the voltage signals may be at a relatively high level such as 10-25 V or more. A test can be performed to detect a faulty output in a charge pump. One approach is to determine if a charge pump can complete an operation such as an erase operation in a specified amount of time. However, this approach may not identify marginal charge pumps which have a small current leak caused by a weak short circuit path, since a charge pump may initially pass such a test when the charge pump is new. However, the leaks can worsen over time when the integrated circuit is used by an end user. For example, in a memory device, a leak can worsen as the device undergoes program-erase cycles.

Figure 3A:
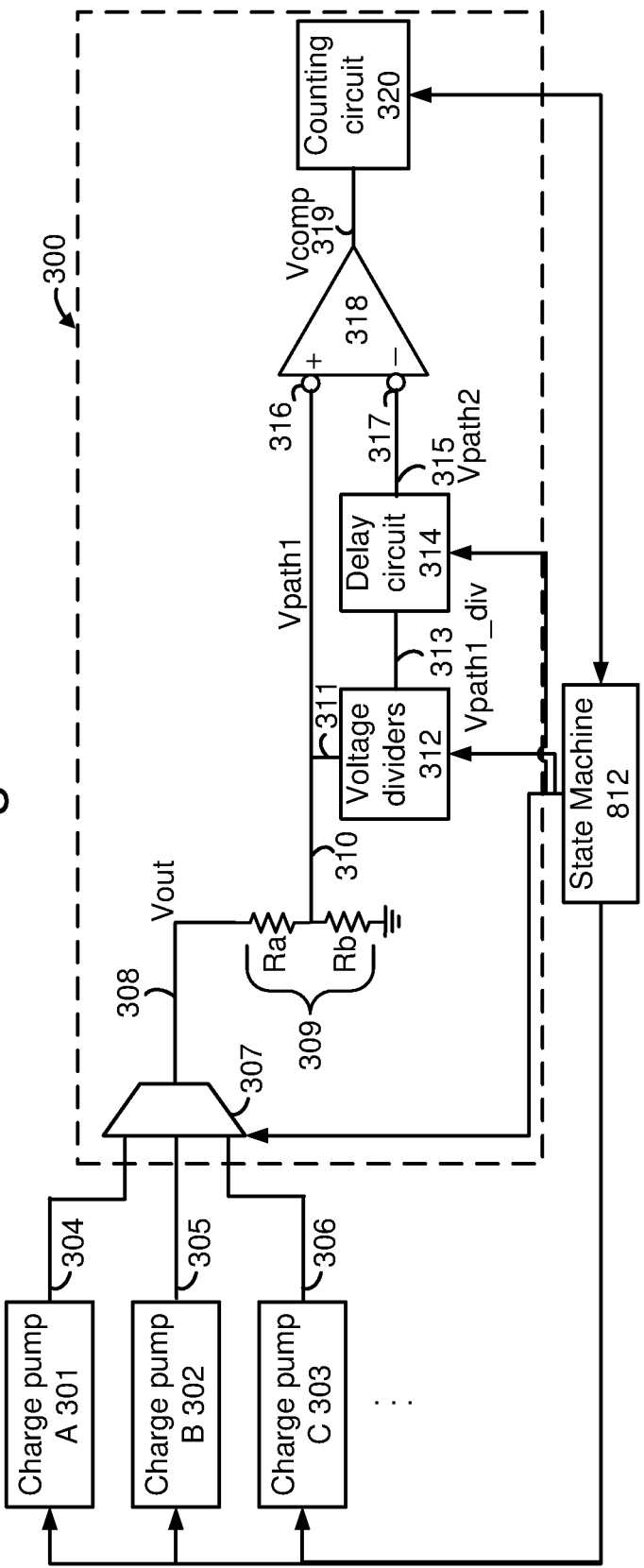
FIG. 3A depicts a circuit for testing for drop-offs in voltage signals of different charge pumps.

Techniques and apparatuses provided herein address the above and other issues. In one approach, a test circuit is provided which detects voltage drop-offs in a voltage signal provided by a charge pump in a test period. Referring to FIG. 3A, for example, a comparator is used to compare the voltage signal to a divided down, delayed version of the signal. A counting circuit is connected to an output of the comparator to count a number of the drop-offs in the test period. A control circuit such as an on-chip state machine manages the test, and compares the number of drop-offs to a maximum allowable number of drop-offs to set a pass/fail status of the charge pump. The control circuit can configure various parameters of the test, including a ratio of a voltage divider, and the maximum allowable number of drop-offs based on the charge pump being tested.

Generally, the techniques can be used to effectively determine problematic voltage signals of charge pumps. Potentially defective chips can be proactively screened for small current leaks at the time of manufacture as well as when the chips are in the field, in the hands of the end users.

These and other benefits are further discussed below.

Figure 1A:
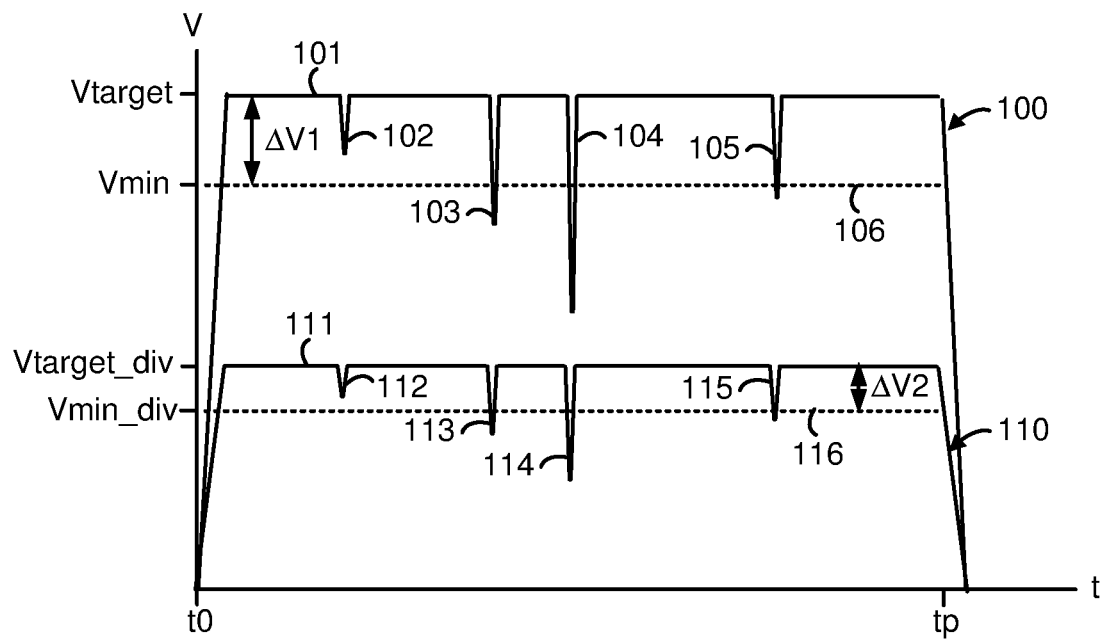
FIG. 1A depicts an example voltage signal output by a charge pump, before and after a voltage divider, where the voltage signal includes voltage drop-offs.

FIG. 1A depicts an example voltage signal output by a charge pump, before and after a voltage divider, where the voltage signal includes voltage drop-offs. The vertical axis depicts voltage and the horizontal axis depicts time. In this example, the charge pump is requested to output a fixed voltage, Vtarget, in a time period t0-tp. The voltage signal of plot 100 initially increases to the desired level, as depicted by plot 101, and is maintained at the desired level until a drop-off (plot 102). The voltage signal quickly recovers to the desired level but a number of additional drop-offs occur, as depicted by plots 103, 104 and 105. Each drop-off represents a sudden down spike in the voltage and can be caused by a defect in the charge pump.

A minimum voltage, Vmin, can be defined as the minimum acceptable level of the voltage signal when the requested output is Vtarget. Vtarget−Vmin=ΔV1 represents an allowable margin in the charge pump output, such as to account for variations in the fabrication process. This margin may be referred to as a guard band voltage and may be determined as a ratio of Vtarget using a voltage divider or as a fixed value. The performance of the charge pump is considered to be acceptable if the voltage remains above Vmin. For example, the drop-off of plot 102 does not fall below Vmin so that this drop-off does not disqualify the charge pump. However, the drop-offs of plots 103-105 do fall below Vmin. These drop-offs can potentially disqualify the charge pump from use. In one approach, a charge pump is allowed to have no more than a maximum allowable number of drop-offs in a specified test period (tp). If it has more than the maximum allowable number of drop-offs, a fail status is set for the charge pump and it is disqualified from use. The entire chip in which the charge pump is located may also be disqualified.

One approach to detecting drop-offs is to use a comparator to compare the voltage signal 100 at the level of Vtarget to another voltage signal (plot 106) at the level of Vmin. However, these voltage signals can be at a relatively high level, so that the comparator has to be relatively large to withstand the voltages. Another approach it to divide down the voltage signals using a voltage divider. The voltage of each signal is reduced according to a ratio of the voltage divider. In this example, the voltage signals of plots 100 and 106 are divided down to provide the voltage signals of plots 110 and 116, respectively. Vtarget is divided down to Vtarget_div, and Vmin is divided down to Vmin_div, where Vtarget_div−Vmin_div=ΔV2 and ΔV2ΔV1.

The voltage signal of plot 110 initially increases to the desired level, Vtarget_div, as depicted by plot 111. The drop-off of plot 112 does not fall below Vmin_div, while the drop-offs of plots 113, 114 and 115 do fall below Vmin_div. Vmin_div is the minimum acceptable level of the voltage signal when the requested output is Vtarget. Vtarget−Vmin=ΔV2 represents an allowable margin or guard band voltage. The performance of the charge pump is considered to be acceptable if the voltage remains above Vmin_div.

A comparator can be used which is reduced in size in accordance with the reduction in voltage to compare the voltage signal 110 at the level of Vtarget_div to another voltage signal (plot 116) at the level of Vmin_div. The comparator can detect each drop-off which falls below Vmin_div.

Figure 1B:
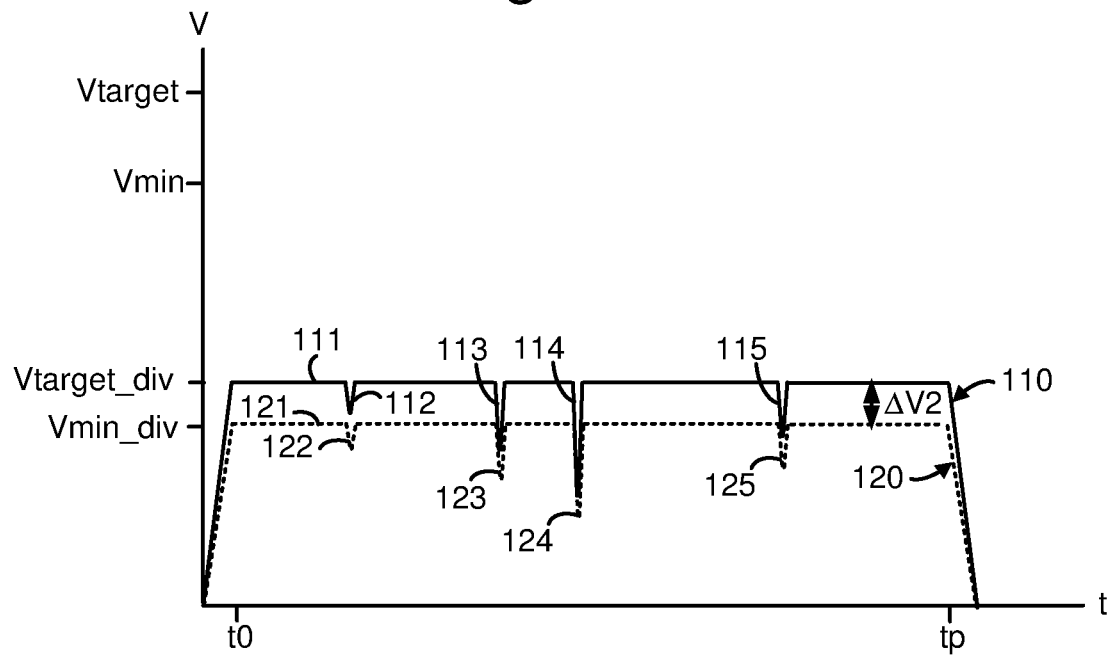
FIG. 1B depicts the voltage signal of plot 110 of FIG. 1A and a divided down version of the voltage signal (plot 120).

FIG. 1B depicts the voltage signal of plot 110 of FIG. 1A and a divided down version of the voltage signal (plot 120). A divided down version of a voltage signal refers to one signal which is derived by reducing the voltage of another signal such as by using a voltage divider. Plot 120 is the same as plot 110 but is divided down, e.g., reduced in magnitude by an amount ΔV2. Plot 120 represents plot 100 divided down twice. The voltage signal of plot 120 initially increases to Vmin_div as depicted by plot 121. The drop-offs of plots 122, 123, 124 and 125 correspond to the drop-offs of plots 112, 113, 114 and 115, respectively.

Figure 1C:
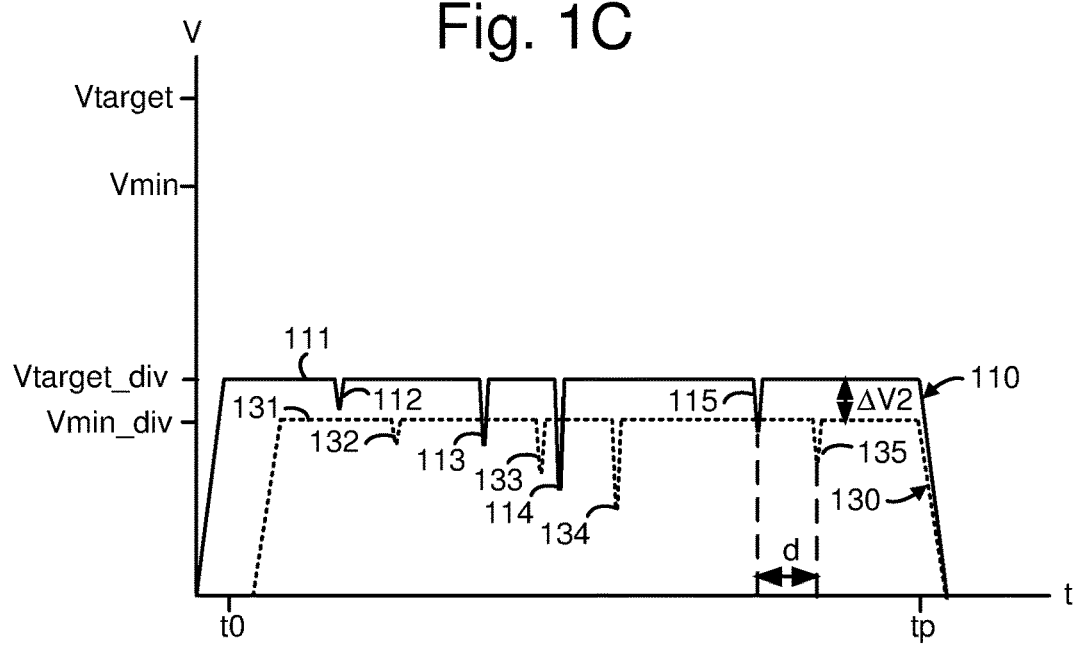
FIG. 1C depicts the voltage signal of plot 110 of FIG. 1B and a delayed version of the voltage signal of plot 120 as plot 130.

FIG. 1C depicts the voltage signal of plot 110 of FIG. 1B and a delayed version of the voltage signal of plot 120 as plot 130. For example, a delay d is depicted between the corresponding drop-offs of plots 115 and 135. The voltage signal of plot 130 initially increases to Vmin_div as depicted by plot 131. The drop-offs of plots 132, 133, 134 and 135 correspond to delayed versions of the drop-offs of plots 112, 113, 114 and 115, respectively.

The drop-off of plot 112 does not fall below Vmin_div, while the drop-offs of plots 113, 114 and 115 do fall below Vmin_div. In this approach, there is no need for a separate voltage generator to provide a voltage signal at the level of Vmin_div. This approach also could be used without dividing down the voltage signal of the charge pump. In this case, the voltage signal of plot 100 can be compared to a delayed version of the voltage signal of plot 100.

By comparing an original voltage signal (e.g., plot 110) to a delayed and divided down version of the original voltage signal (e.g., plot 130), a desired guard band voltage (Vtarget_div−Vmin_div=ΔV2) can be defined for testing the performance of a charge pump. Further, the delay ensures that the drop-offs do not align in the two signals, so that the drop-off in plot 110 is measured against Vmin_div and not a lower level. Generally, it is highly unlikely that drop-offs align in the two signals. If a drop-off in the non-delayed signal 110 did align with a drop off in the delayed signal of plot 130, it is possible that the drop-off in the signal 110 is not detected. The techniques provided herein can allow for testing using multiple delay levels to address this unlikely case.

Figure 1D:
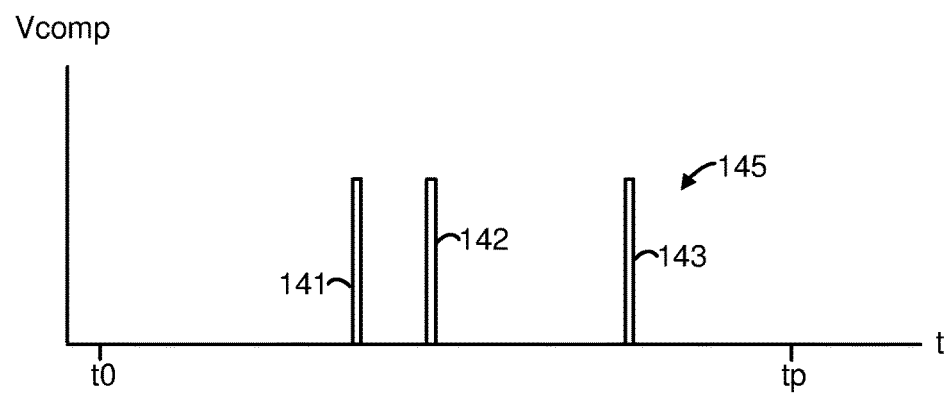
FIG. 1D depicts a signal 145 comprising pulses which identify drop-offs in the voltage signal 110 of FIG. 1C.

FIG. 1D depicts a signal 145 comprising pulses which identify drop-offs in the voltage signal 110 of FIG. 1C. The pulses 141, 142 and 143 represent a voltage increase from a low level to a high level followed by a decrease back to the low level for each of the drop-offs of plots 113, 114 and 115, respectively. The drop off of the plot 112 is not large enough to trigger a pulse. In one approach, the signal is a voltage signal output by the comparator 318 of FIG. 3A.

Figure 2:
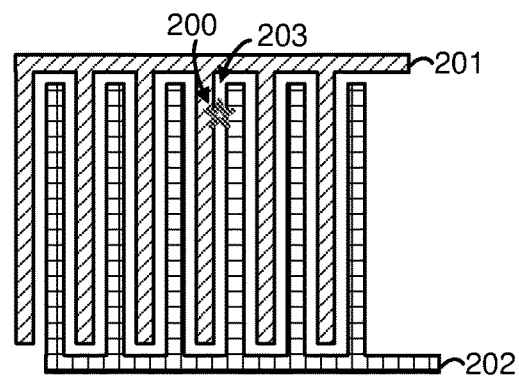
FIG. 2 depicts a cross-sectional view of a capacitor in a charge pump, showing a defect which can cause voltage drop-offs as depicted in FIG. 1A-1C.

FIG. 2 depicts a cross-sectional view of a capacitor in a charge pump, showing a defect which can cause voltage drop-offs as depicted in FIG. 1A-1C. A leaky path 200, or weak short circuit, is depicted in an oxide 203 between parallel plates 201 and 202 of the capacitor. One of the plates is at a high voltage and the other plate is grounded. Such a defect is caused during fabrication and can worsen over time. This is one example of a defect in a charge pump which can lead to an unstable output including voltage drop-offs. The capacitor in this example has a finger structure, where the plates are formed by metal lines in a metal-oxide-metal MOM configuration.

FIG. 3A depicts a test circuit 300 for testing for drop-offs in voltage signals of different charge pumps. Generally, testing can occur for one or more charge pumps on a chip.

Efficiencies are achieved by using the same testing circuit for multiple charge pumps. In this example, there are three charge pumps, charge pump A 301, charge pump B 302 and charge pump C 303, which provide a respective output voltage signal on a respective output path 304, 305 and 306. In other cases, such as in FIG. 6A, additional charge pumps can be connected to the test circuit for testing. Each charge pump can be in a charge pump circuit such as in FIG. 4.

The output paths are provided as inputs to a multiplexer 307. The multiplexer is thus connected to output paths of a plurality of charge pumps, and a control circuit such as the state machine is configured to provide a signal to the multiplexer selecting a charge pump from among a plurality of charge pumps.

For a given test, one of the charge pumps is selected and its output is passed by the multiplexer to a path 308 as a voltage Vout. Vout can be divided down by a second voltage divider 309 to provide a divided down voltage signal Vpath1 at a path 310. The path 310 is connected between resistors Ra and Rb of the voltage divider so that Vpath1=Vout×Rb/(Ra+Rb). The ratio could be one half or less, for example. For example, Vout may correspond to the plot 100 of FIG. 1A having a nominal voltage of Vtarget, and Vpath1 may correspond to the plot 110 of FIG. 1A having a nominal voltage of Vtarget_div, where Vtarget_div=Vtarget×Rb/(Ra+Rb). The nominal voltage of a voltage signal refers to the voltage when a drop-off does not occur. This is the requested or target output voltage of a charge pump.

Figure 3D:
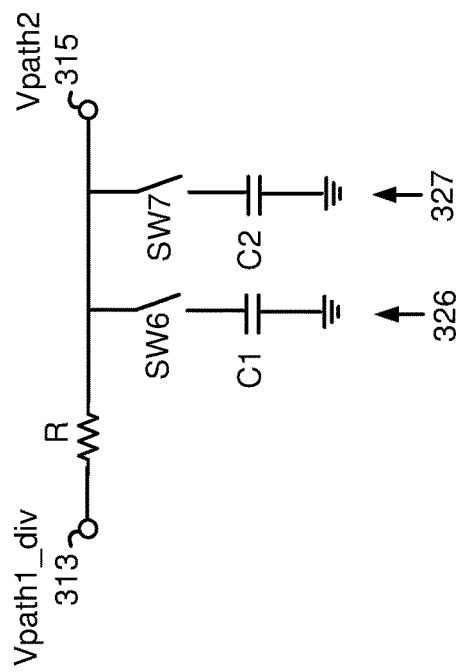
FIG. 3D depicts an example implementation of the delay circuit 314 of FIG. 3A.
Figure 3B:
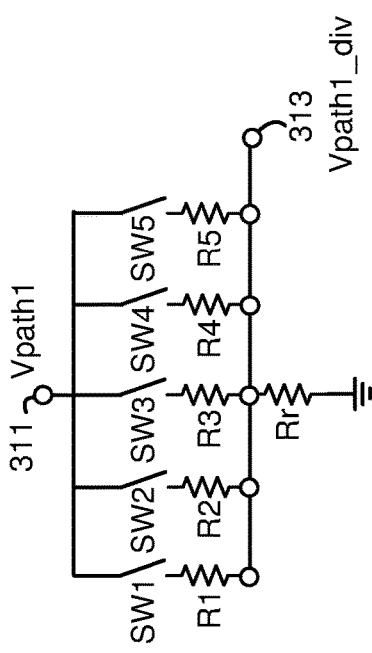
FIG. 3B depicts an example implementation of the set of voltage dividers 312 of FIG. 3A.
Figure 3C:
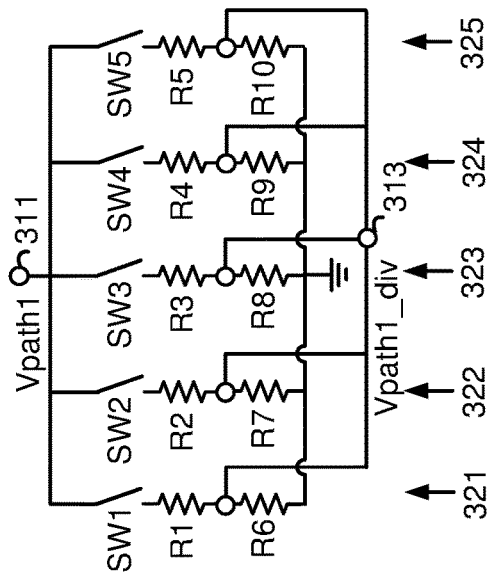
FIG. 3C depicts another example implementation of the set of voltage dividers 312 of FIG. 3A.

A set of first voltage dividers 312 is connected to the path 310 by a path 311. The set of first voltage dividers may be configured, e.g., as depicted in FIGS. 3B and 3C. One voltage divider is selected in the set to divide down Vpath1 based on a desired guard band voltage. For example, Vpath1 may correspond to the plot 110 of FIG. 1B having a nominal voltage of Vtarget_div, and the voltage signal on the path 313, Vpath1_div, may correspond to the plot 120 of FIG. 1B having a nominal voltage of Vmin_div.

The divided down signal is output on the path 313 to a delay circuit 314. The delay circuit can be configured to provide one or more specified delays to the voltage signal on the path 313 and provide a corresponding delayed signal on the path 315 as Vpath2. The delay circuit may be configured, e.g., as depicted in FIG. 3D. For example, the non-delayed voltage signal on the path 313 may correspond to the plot 120 of FIG. 1B having the nominal voltage of Vmin_div, and the delayed voltage signal on the path 315 may correspond to the plot 130 of FIG. 1C having the nominal voltage of Vmin_div. The delay circuit can optionally be provided before the voltage dividers.

The voltage signal on the path 310 (a first input path) has the voltage Vpath1 and is provided to a first input, e.g., a non-inverting input 316, of a comparator 318. The voltage signal on the path 315 (a second input path) has the voltage Vpath2 and is provided to a second input 317, e.g., an inverting input, of the comparator. The comparator is an example of an op-amp comparator circuit. When Vpath1<Vpath2, the voltage Vcomp at an output path 319 of the comparator is high. When Vpath1>Vpath2, Vcomp is low. See also FIG. 1D for an example voltage signal, including pulses 141-143, of the path 319. A counting circuit 320 receives the voltage signal on the path 319 and counts a number of times the voltage signal transitions from low to high, for example. Each transition corresponds to a downward transition or drop-off in a voltage (Vpath1) on the first input path 310, where the downward transition is below Vpath2 and therefore more than a guard band voltage set by a voltage divider in the set of voltage dividers 312.

Figure 3E:
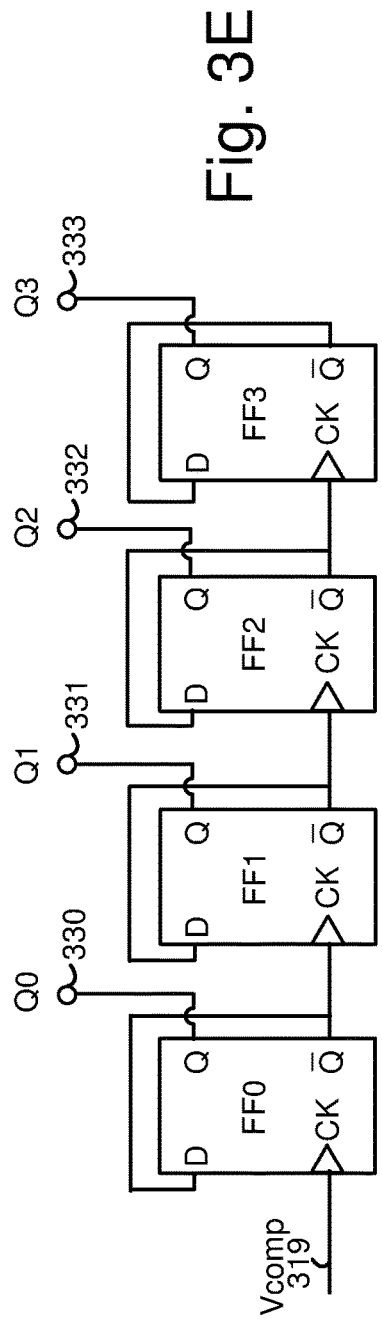
FIG. 3E depicts an example implementation of the counting circuit 320 of FIG. 3A.

Essentially, the counting circuit 320 counts a number of pulses in the voltage signal on path 319. An example counting circuit is depicted in FIG. 3E.

A state machine 812 or other control circuit can be provided on the chip to communicate with the various components and manage the test. The state machine is one example of a control circuit. Other embodiments for a control circuit include, e.g., a microprocessor, microcontroller, FPGA, a hardware only circuit, a hardware with software circuit and so forth.

For example, the state machine may send a request to activate one of the charge pumps 301-303 for a test. The state machine may send a request to the multiplexer 307 to connect the output path of the selected charge pump to the path 308. The state machine may send a request to the set of voltage dividers 312 to select one of the voltage dividers, e.g., using a corresponding switch as depicted in FIGS. 3B and 3C. The state machine may send a request to the set of delay circuits 314 to select one of the delay circuits, e.g., using a corresponding switch as depicted in FIG. 3D.

In this example, the test circuit 300 is separate from the state machine, which may be a pre-existing component on a chip. In this way, the functionality of the test circuit can easily be added to a chip which has a state machine. The state machine can be configured with firmware for performing the functions described herein.

FIG. 3B depicts an example implementation of the set of voltage dividers 312 of FIG. 3A. Vpath1 is input on the path 311 and a divided down voltage Vpath1_div is output on the path 313. In this example, five separate voltage dividers with different respective ratios are provided. A set of resistors R1-R5 are connected to switches SW1-SW5, respectively. A resistor Rr is connected between the path 313 and ground. One of the switches can be selected, e.g., switched on or made conductive, to select a corresponding ratio. The remaining switches are switched off or non-conductive. For example, if SW1, SW2, SW3, SW4 and SW5 is selected, the ratio is Rr/(R1+Rr), Rr/(R2+Rr), Rr/(R3+Rr), Rr/(R4+Rr) or Rr/(R5+Rr), respectively. R1-R5 are the top resistors and Rr is the bottom resistor. A larger value of the top resistor results in a lower ratio, a lower output voltage and a larger guard band. The output voltage, Vpath1_div, is equal to Vpath1×ratio. This approach is efficient since there is a single bottom resistor.

As an alternative, more than one switch can be switched on to obtain other ratios.

FIG. 3C depicts another example implementation of the set of voltage dividers 312 of FIG. 3A. This approach provides greater flexibility than FIG. 3B since the top and bottom resistors can differ in each voltage divider. In this example, five separate voltage dividers 321-325 (first voltage dividers) with different respective ratios are provided. The set of top resistors R1-R5 are connected to switches SW1-SW5, respectively, as in FIG. 3B. However, a different bottom resistor R6-R10 is connected in series with each top resistor R1-R5, respectively. One of the switches can be selected, e.g., switched on or made conductive, to select a corresponding ratio, while the remaining switches are switched off or non-conductive. For example, if SW1, SW2, SW3, SW4 or SW5 is selected, the ratio is R6/(R1+R6), R7/(R2+R7), R8/(R3+R8), R9/(R4+R9) or R10/(R5+R10), respectively.

FIG. 3D depicts an example implementation of the delay circuit 314 of FIG. 3A. This example provides a set of two delay circuits. Vpath1_div is input on the path 313 and Vpath2 is output on the path 315. The set of delay circuits includes a resistor R in series with the paths 313 and 315. A first delay circuit 326 comprises the resistor R and the capacitor C1, and a second delay circuit 327 comprises the resistor R and the capacitor C2. C1 and C2 are connected to the resistor R by switches SW6 and SW7, respectively. To select the delay of C1, SW6 is switched on and SW7 is switched off. To select the delay of C2, SW7 is switched on and SW6 is switched off. As an alternative, more than one switch can be switched on to obtain other delays.

The delay circuit provides a delay which is proportional to the time constant RC. Thus, a larger capacitance and a larger resistance corresponds to a larger delay. The resistor reduces the amount of current flowing into the capacitor when a voltage transition occurs such as a drop-off. When the drop-off occurs in Vpath1_div, the capacitor will take some time to discharge before the drop-off is provided in Vpath2. The discharge time will be larger when the drop-off is greater. After the drop-off, the capacitor will charge back up to the nominal voltage of Vmin_div (FIG. 1C).

FIG. 3E depicts an example implementation of the counting circuit 320 of FIG. 3A. The counting circuit can comprise a number of flip-flops FF0-FF3. The example depicts a four bit asynchronous up counter which comprises four positive edge triggered D type flip-flops connected in toggle mode. Each flip flop has a clock (CK) input. Data from an output Q bar is fed back to a data input (D), and an output Q is connected to a bit node. For example, FF0-FF3 have bit nodes 330-333, respectively. The bit nodes provide respective bits Q0-Q3 of a four bit word, e.g., a digital count, which indicates the number of pulses which have been counted. Up to 16 pulses can be counted. Q0 is the least significant bit and Q3 is the most significant bit, so that the four bit word provide a decimal value based on: Q0×1+Q1×2+Q2×4+Q3×8.

Figure 3F:
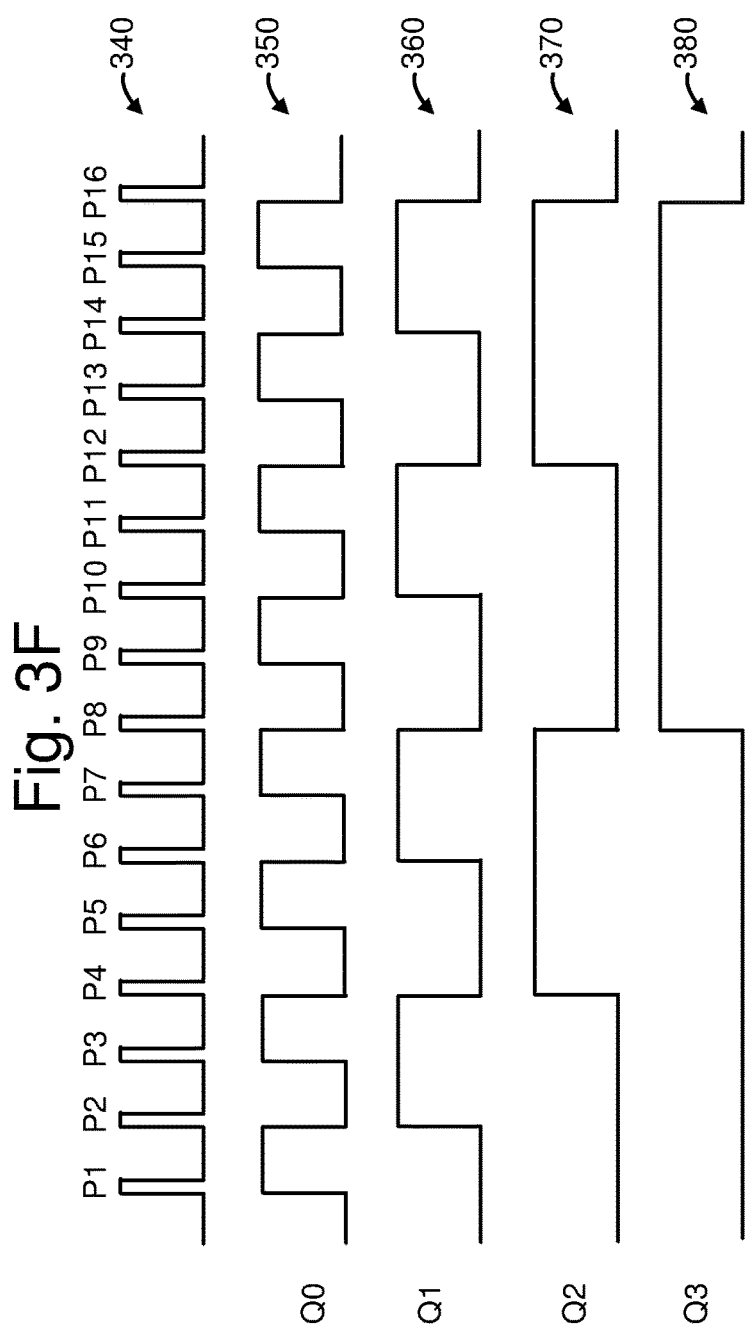
FIG. 3F depicts waveforms for a counting process in the circuit if FIG. 3E.

FIG. 3F depicts waveforms for a counting process in the circuit if FIG. 3E. The waveform 340 includes sixteen example pulses P1-P16 and is input to the CK input of FF0. The pulses, which represent voltage drop-offs, are spaced equally in time in this example although in practice they can be unequally spaced. The waveforms 350, 360, 370 and 380 depict Q0, Q1, Q2 and Q3, respectively. A low or high level of the waveform depicts a logical 0 or 1, respectively. Generally, the rising edge of the Q output of each flip-flop triggers the CK input of the next flip-flop at half the frequency of the CK pulses applied to its input.

Assuming that the four Q outputs are initially at 0000, the rising edge of the first pulse P1 applied will cause Q0 to transition to logic 1, and the rising edge of second pulse P2 will cause Q0 to return to logic 0. The process continues with each pulse such that the rising edge of the odd-numbered pulses cause Q0 to transition to logic 1, and the rising edge of the even-numbered pulses cause Q0 to return to logic 0. In a similar way, the rising edge of P2, P6, P10 and P14 will cause Q1 to transition to logic 1, and the rising edge of P4, P8, P12 and P16 cause Q1 to return to logic 0. The rising edge of P4 and P12 will cause Q2 to transition to logic 1, and the rising edge of P8 and P16 cause Q2 to return to logic 0. The rising edge of P8 will cause Q3 to transition to logic 1, and the rising edge of P16 will cause Q3 to return to logic 0.

Figure 4:
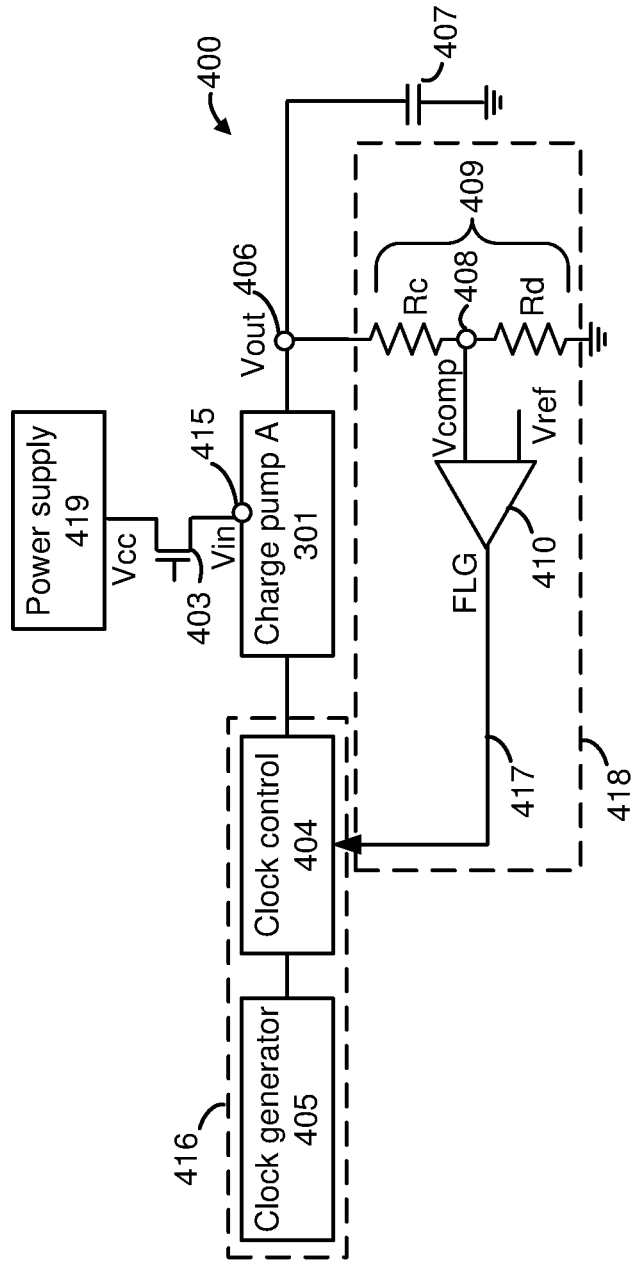
FIG. 4 depicts an example of a charge pump circuit 400 comprising the charge pump A 301 of FIG. 3A.

FIG. 4 depicts an example of a charge pump circuit 400 comprising the charge pump A 301 of FIG. 3A. A similar charge pump circuit can be provided for each of the other charge pumps. The charge pump 301 has an input node 415 and an output node 406. The output node is connected to a load such as a capacitive load 407. For example, in a memory system, the load can represent a word line, bit line, source line or substrate. The load can represent a component in a circuit which operates using the voltage output of the charge pump.

A clamp transistor 403 can be used to clamp an input voltage at the input node 415 to Vin, due to potential variations in the supply voltage Vcc from a power supply 419. This ensures that the input voltage is fixed even if Vcc varies. The clamp transistor may be an nMOSFET in which the source voltage, Vin, is equal to the control gate voltage minus the threshold voltage (Vth) of the transistor.

A clock source 416 provides a clock signal constantly or alternatingly to the charge pump 301. The clock source, which is a circuit, includes a clock generator 405 which outputs a constant clock signal at a specified frequency to a clock control circuit 404. See FIG. 7A. The clock control circuit provides a gating function to either block the signal from reaching the charge pump, or passing the clock signal to the charge pump. For example, the clock signal may be passed when the voltage output of the charge pump is below a desired voltage and blocked when the voltage output of the charge pump is above the desired voltage. The desired voltage can be a fixed level or an increasing level such as a ramp.

The clock signal is responsive to a feedback circuit 418 which includes a feedback path 417, a comparator 410 and a voltage divider 409. The voltage divider 409 divides the output voltage Vout using resistors Rc and Rd to provide a comparison voltage Vcomp at a node 408. Rd can be adjustable to provide voltage trimming Vcomp is compared to a reference voltage Vref at the comparator to set a flag FLG. FLG=0 if Vcomp>Vref and FLG=1 if Vcomp<=Vref. Note that Vcomp is a known fraction Rd/(Rc+Rd) of Vout, so that a comparison of Vcomp to Vref by the comparator is equivalent to a comparison of Vout to a specified output voltage.

When FLG=1, the clock control circuit passes the clock signal to the charge pump to operate the charge pump in a pumping mode, where charge is transferred from the input node 415 of the charge pump at an input voltage Vin to the output node 406. When FLG=0, the clock control circuit does not pass the clock signal to the charge pump, so that the charge pump operates in a non-pumping mode, where charge is not transferred from the input node to the output node. Vout will tend to decay in the non-pumping mode as the load is driven.

Figure 5A:
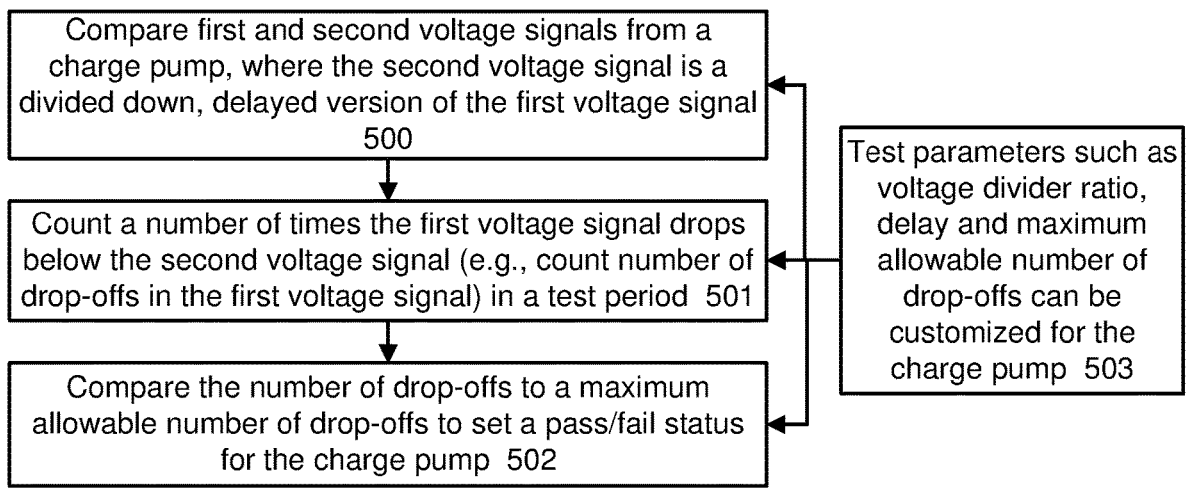
FIG. 5A depicts a flowchart of an example process for testing the voltage output of a charge pump for drop-offs.

FIG. 5A depicts a flowchart of an example process for testing the voltage output of a charge pump for drop-offs. Step 500 includes comparing first and second voltage signals from a charge pump, where the second voltage signal (e.g., Vpath2 in FIG. 3A) is a divided down, delayed version of the first voltage signal (e.g., Vpath1 in FIG. 3A). Step 501 includes counting a number of times the first voltage signal drops below the second voltage signal (e.g., counting a number of drop-offs in the first voltage signal) in a test period. For example, as mentioned, the drop-offs can be counted by counting the pulses (FIG. 1D) at the output of a comparator. Step 502 includes comparing the number of drop-offs to a maximum allowable number of drop-offs to set a pass/fail status for the charge pump. Step 503 notes that test parameters such as a voltage divider ratio (e.g., for the voltage dividers of FIGS. 3B and 3C), a delay (e.g., for the delay circuits of FIG. 3D) and maximum allowable number of drop-offs can be customized for the charge pump. See also FIG. 6A-6D.

Figure 5B:
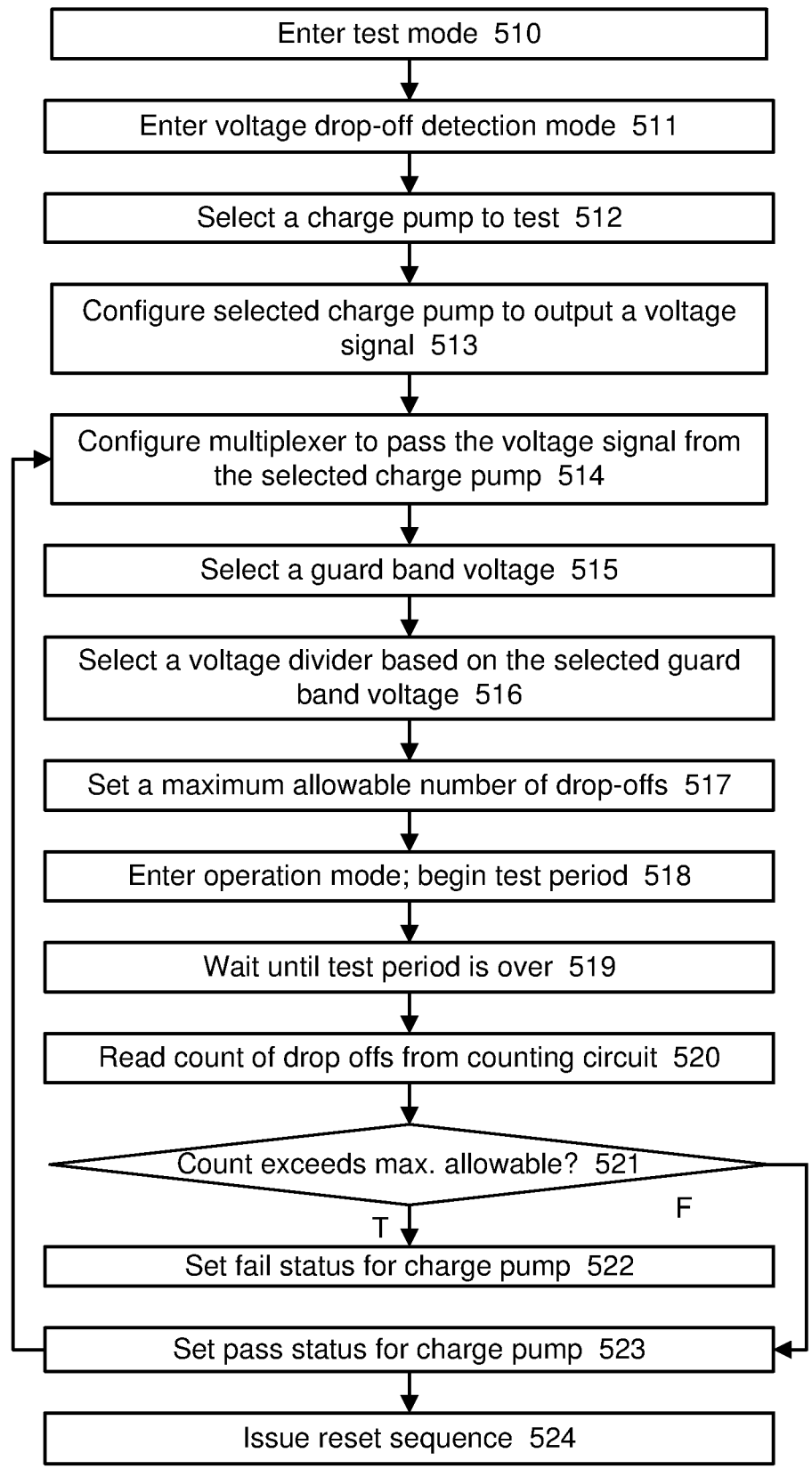
FIG. 5B depicts a flowchart of another example process for testing the voltage output of a charge pump for drop-offs, consistent with FIG. 5A.

FIG. 5B depicts a flowchart of another example process for testing the voltage output of a charge pump for drop-offs, consistent with FIG. 5A. Step 510 includes entering a test mode at a control circuit. For example, this can be a built in self-test (BIST) mode of a state machine. Various test modes may be possible. Moreover, the control circuit may enter a mode, issue requests and perform other actions by issuing commands using firmware. Further details regarding commands are provided below.

Step 511 includes entering a voltage drop-off detection mode. Step 513 includes configuring a selected charge pump to output a voltage signal. For example, FIG. 3A shows how a state machine 812 can communicate with charge pumps 301-303 to instruct one of the charge pumps to begin outputting a voltage signal. In one approach, the selected charge pump outputs a fixed voltage at its highest output level, as this stresses the charge pump to the highest degree and is most likely to reveal drop-offs caused by defects such as weak short circuit paths. Alternatively, the control circuit can specify a particular voltage output in a range of available outputs of the charge pump.

Step 514 includes configuring a multiplexer (e.g., the multiplexer 307 in FIG. 3A) to pass the voltage signal from the selected charge pump, e.g., from one of the paths 304-306 to the path 308. Step 515 includes selecting a guard band voltage, e.g., ΔV2 in FIG. 1C. Step 516 includes selecting a voltage divider based on the selected guard band voltage. For example, FIG. 3A show how a state machine 812 can communicate with the set of voltage dividers 312, and FIGS. 3B and 3C show how switches can be configured to select one voltage divider (or ratio) among multiple voltage dividers (or ratios). The control circuit can also access a table for steps 514 and 515 such as depicted in FIG. 6B.

Step 517 includes setting a maximum allowable number of drop-offs. The control circuit can set this internally by accessing a table using a command and address. For example, see FIG. 6C. Step 518 includes entering an operation mode and beginning a test period. During the test period, the number of drop-offs is counted, as discussed. These are drop-offs whose magnitude exceeds the guard band voltage. Step 519 includes waiting until the test period is over. Step 520 includes reading a count of the number of drop-offs from the counting circuit. For example, the control circuit may communicate with the counting circuit 320 in FIG. 3A to obtain a digital count which indicates the number of pulses which have been counted in the output of the comparator 318. See also FIGS. 3E and 3F.

A decision step 521 determines whether the count exceeds the maximum (max.) allowable count. If the decision step 521 is true (T), step 522 sets a fail status for the charge pump. The die may have to be disabled in this case. In some cases, an alternative or backup die is available in a device. Or, an alternative or backup charge pump may be available on the same die as the failed charge pump. If the decision step 521 is false (F), step 523 sets a pass status for the charge pump. Assuming there are no other faults, the die can therefore be delivered to the end user. Step 524 issues a reset sequence indicating that the test is completed.

Various commands can be issued by a control circuit such as the on-chip state machine to carry out the test, as depicted below.

CMD xx; //This command can be issued at step 511 to enter the drop-off detection mode.

CMD 55, Addr 0xh, DATA xx; //This command can be issued at step 512 to select a charge pump, consistent with FIG. 6A.

CMD 55, Addr xxh, DATA yy; //This command can be issued at step 515 to select a guard band voltage, consistent with FIG. 6B.

CMD 55, Addr yyh, DATA zz; //This command can be issued at step 517 to set a maximum allowable number of drop-offs, consistent with FIG. 6C.

CMD 1E; //This command is used for unselecting blocks.

CMD 80h; ADDR*5; CMD yyh; //This command can be issued at step 518. A pre-determined consistent voltage output can be set by the command CMD yyh.

Delay "X"; //This command can be issued at step 519 to set the duration of the test in milliseconds.

CMD 70h; RD; // This command can be issued at step 520 to read (RD) the count of drop-offs and check the pass/fail status.

FIG. 6A is a table for use in connection with step 512 of FIG. 5B which cross-references different charge pumps to different addresses. The tables of FIG. 6A-6C may be provided as part of the state machine 812, for example. The state machine may have the ability to test multiple charge pumps on a chip, one charge pump at a time. In this example, there are eight charge pumps labelled as A-H. Charge pumps A-C were depicted in FIG. 3A. The state machine can issue an address 0xh which corresponds to a particular charge pump to select that charge pump for testing. The binary values 000, 001, 010, 011, 100, 101, 110 and 111 correspond to the charge pumps A-H, respectively.

Example voltage signals which are provided by the different charge pumps in a memory device can include a program voltage, erase voltage, read voltage, bit line voltage and unselected word line voltage.

FIG. 6B is a table for use in connection with step 515 of FIG. 5B which cross-references different guard bands to different addresses. The state machine may have the ability to set different guard bands when testing a charge pump. Recall from FIG. 3A-3C that one voltage divider can be selected from among the set of voltage dividers 312. In one approach, the guard band is defined by a ratio of a voltage divider. The ratio defines the guard band in terms of the amount by which a voltage is decreased by a voltage divider. Thus, guard band=input voltage×(1−ratio). For example, in FIG. 3C, the ratio of the voltage diver 321 is R6/(R1+R6). Thus, the guard band voltage is Vpath1×(1−R6/(R1+R6)). If the ratio is 0.90, for example, the guard band is Vpath1×0.1. If Vpath1=10 V, the guard band is 1 V. Recall that Vpath1 is a divided down signal obtained from Vout in FIG. 3A using the second voltage divider 309. As an example, Vpath1=10 V when Vout=20 V and when the ratio of the second voltage divider 309 is 0.5.

In this example, there are five voltage guard bands, consistent with FIGS. 3B and 3C. The state machine can issue an address xxh which corresponds to a particular guard band and voltage divider. In this example, the binary values 000, 001, 010, 011 and 100 correspond to ratios of 0.98, 0.96, 0.94, 0.92 and 0.90, respectively. If Vpath1=10 V, the binary values 000, 001, 010, 011 and 100 correspond to guard band voltages of 0.2, 0.4, 0.6, 0.8 and 1.0, respectively.

FIG. 6C is a table for use in connection with step 517 of FIG. 5B which cross-references different maximum allowable numbers of drop-offs to different addresses. The state machine may have the ability to set different maximum allowable numbers of drop-offs in a test. The number can be based on various factors such as the duration of the test, and the number of drop-offs which can be tolerated by a circuit connected to the charge pump being tested.

In this example, there are five values of the number. The state machine can issue an address yyh which corresponds to a number. In this example, the binary values 000, 001, 010, 011 and 100 correspond to the values of 1, 2, 4, 6 and 8 drop-offs, respectively.

Other test parameters which could be customized for a test include the delay time d. For example, a table can be provided which cross-references different addresses to different delays, such as 1, 5, 10, or 100 microseconds.

Note that a test can be repeated with different parameters to provide a pass/fail determination for a charge pump. For example, a test can be repeated with different levels of guard band and/or maximum allowable number of drop-offs. In one approach, the test is repeated with larger guard band but a smaller maximum allowable number of drop-offs. The final result of pass or fail can be based on an interim result from each test. It is also possible to classify a charge pump a designation other than pass or fail. For example, a charge pump can be given a score, e.g., from one to ten, in terms of the likelihood of failure over the life of the chip. In another approach, the test is repeated at different times over the life of the chip. If there is a downtrend in the scores, an action can be taken such as repeating the test more frequently or switching to an alternative or backup charge pump.

FIG. 7A to FIG. 7D provide example configurations of a charge pump. A charge pump can use a capacitor to transfer charge from an input node to an output node. In one approach, a MOS (metal oxide semiconductor) capacitor is used. A capacitor can be formed by depositing a layer of metallic conductive material onto a layer of oxide that has been deposited or grown on a layer of semiconductor material, such as a semiconductor wafer, referred to as the body. The semiconductor material may be p-type or n-type, based on the polarity of the body, in which case the capacitor is referred to as being p-type or n-type, respectively. The top conducting layer may be considered to be a gate terminal, while the bottom conducting layer is a source, drain or bulk terminal. In one approach, a capacitor can be formed from a MOSFET by tying its drain, source and bulk terminal together and using the resulting device as a two-terminal device.

To be used as flying capacitor, the technology should provide an opportunity to connect the bulk terminal of the capacitor to a voltage different from that of a substrate. For standard digital technology (p-type substrate, no triple-well) an nMOS capacitor can be used, while for an n-type substrate, a pMOS capacitor can be used. For triple-well technology, any type can be used. For the follower configuration, one terminal is always grounded, so a pMOS or nMOS capacitor can be used. The capacitor can be a metal-oxide-metal (MOM) capacitor typically having a finger structure, or a metal-insulator-metal (MIM) capacitor typically having a plate structure, for example.

FIG. 6D is a table for use in connection with step 517 of FIG. 5B which cross-references charge pumps to a different guard band ratios and maximum allowable numbers of drop-offs. As mentioned in connection with step 503, test parameters such as a voltage divider ratio, a delay and a maximum allowable number of drop-offs can be customized for a charge pump. In this example, each charge pump identifier is cross-reference to a guard band ratio (voltage divider ratio) and a maximum allowable number of drop-offs. For example, charge pumps A, B and C are cross-referenced to ratios of 0.98, 0.92 and 0.96, respectively, and to maximum allowable number of drop-offs of 1, 4 and 2, respectively. This is just one example, as each charge pump can be cross-referenced to any ratio and to any maximum allowable number of drop-offs.

For instance, for a charge pump where it is highly important to have a steady output with no or few drop-offs, the ratio can be relatively large, defining a relatively small guard band, and the maximum allowable number of drop-offs can be relatively small.

Figure 7A:
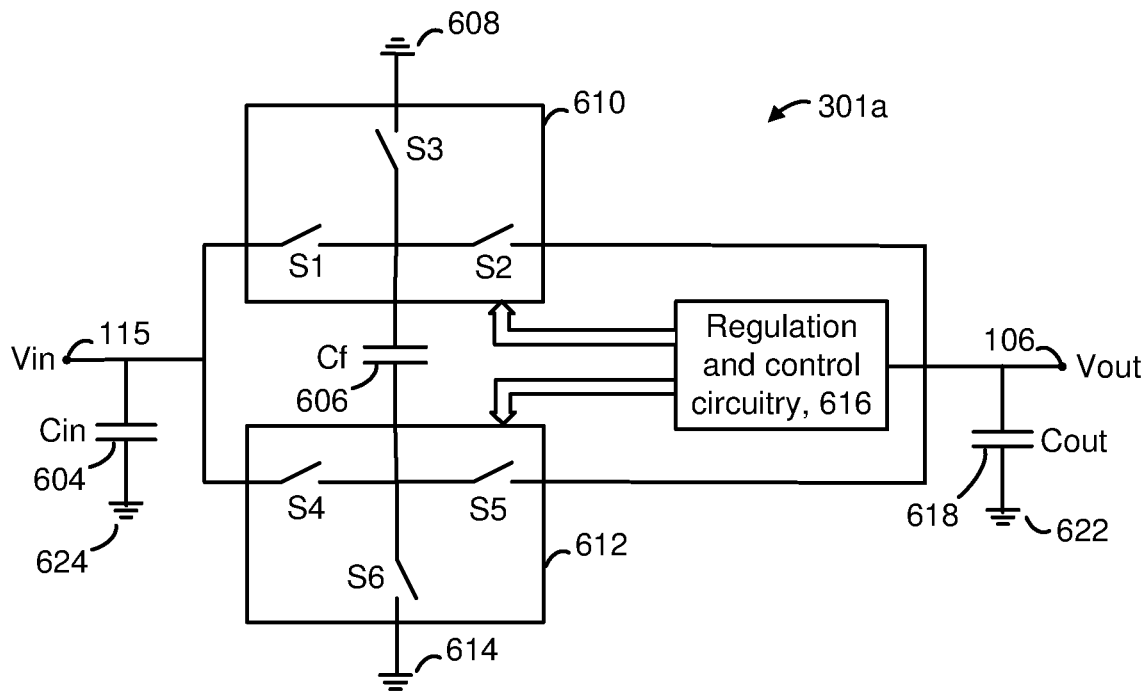

FIG. 7A depicts an example implementation of the charge pump 301 of FIG. 3A configured as a single-stage charge pump 301a. A charge pump generally refers to a switching voltage converter that employs an intermediate capacitive storage element which is sometimes referred to as a flying capacitor or a charge transfer capacitor. One or more flying capacitors can be used. Moreover, a charge pump can include multiple stages connected in series to obtain special features such as a high output voltage and a greater range of output voltages. A charge pump can be constructed or configured for providing voltage conversion for applications including: multiplier, divider, inverter and follower. The principles discussed herein can be applied to one or more stages, and to one or more capacitors in a stage. The charge pump 301a is a generalized embodiment which can be controlled for multiplier, divider, inverter and follower applications. The charge pump 301a includes an input node 415 at which a voltage Vin is applied. For example, Vin may be a fixed power supply voltage sometimes referred to as Vdd or Vcc in a semiconductor chip. Charge from the voltage is maintained in an input capacitor Cin 604 which is connected to a ground node 624.

A first set of switches 610 and a second set of switches 612 are controlled by regulation and control circuitry 616 to transfer charge from the input node 415 to a flying capacitor Cf 606, and from Cf 606 to an output node 406. Vout is a resulting voltage at the output node 406, and can be greater than or less than Vin. The output node is coupled to an output capacitor Cout 618, which is connected to a ground node 622. The first set of switches 610 includes switches S1, S2 and S3 which are star-connected to one terminal (such as the top conductor) of Cf. The switches may be MOSFETs, bipolar junction transistors, relay switches, or the like. S1 connects the top conductor of Cf to the input node 415 to receive a charge from Vin. S2 connects the top conductor of Cf to the output node 406 to transfer its charge to the output node. S3 connects the top conductor of Cf to a ground node 608. Similarly, the second set of switches 612 includes switches S4, S5 and S6 which are star-connected to another terminal (such as the bottom conductor) of Cf. S4 connects the bottom conductor of Cf to the input node 415 to receive a charge from Vin. S5 connects the bottom conductor of Cf to the output node 406 to transfer its charge to the output node. S6 connects the bottom conductor of Cf to a ground node 614.

Generally, the charge pump operation includes two main phases: charging Cf from the input node, and discharging Cf into the output node. During each phase, one of the switches in each set of switches is closed, connecting Cf to either the input node, the output node, or a ground node. Further, the regulation and control circuitry 616 provides the switches with appropriate control signals, including frequency, phases, amplitudes, delays, etc., depending on the particular application. The regulation and control circuitry 616 may communicate with the output node 406 as well such as to detect its level. Note that the circuits shown are examples only, as various modifications can be made.

Figure 7B:
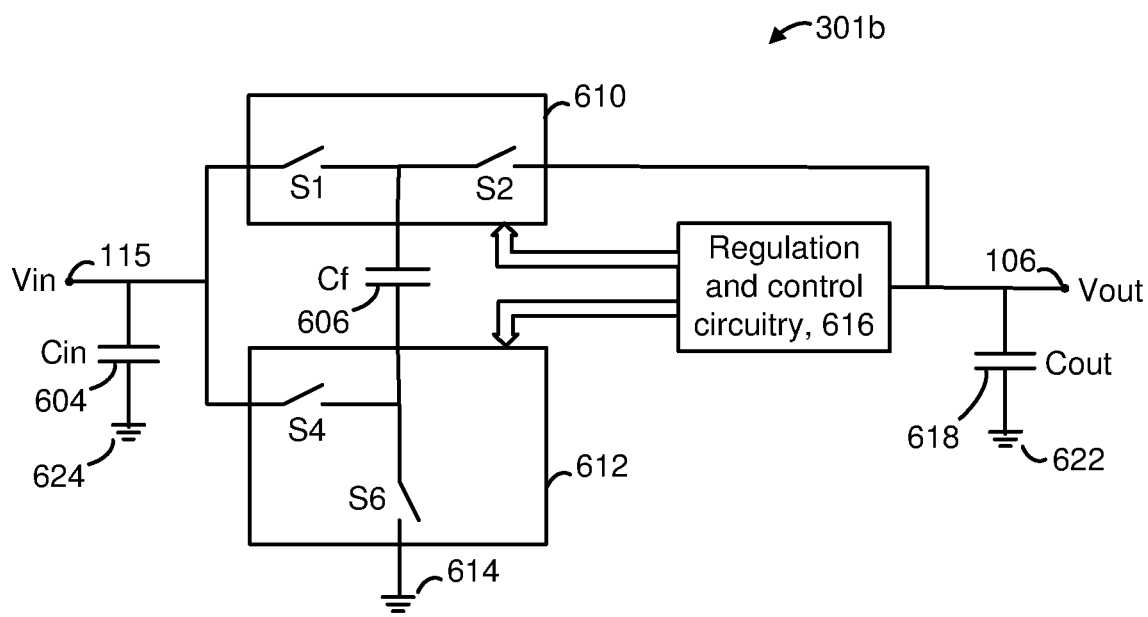
FIG. 7B depicts an example implementation of the charge pump 301 of FIG. 3A configured as a voltage multiplier.

FIG. 7B depicts an example implementation of the charge pump 301 of FIG. 3A configured as a voltage multiplier. A voltage multiplier, or step-up charge pump, in general, provides Vout>Vin. The charge pump 301b provides 2×Vin>Vout>Vin, and the switches S3 and S5 of FIG. 7A are not needed. In a charging phase, the regulation and control circuitry 616 provides the switches with appropriate control signals so that S1 is closed, e.g., conductive, and S2 is open, e.g., non-conductive, so that Cf is charged via S1. Further, S4 is open and S6 is closed so that the bottom conductor of Cf is connected to the ground node 614. In a discharging phase, S1 is open and S2 is closed, so that Cf is discharged, at least in part, to the output node 406 via S2. Further, S4 is closed and S6 is open.

Figure 7C:
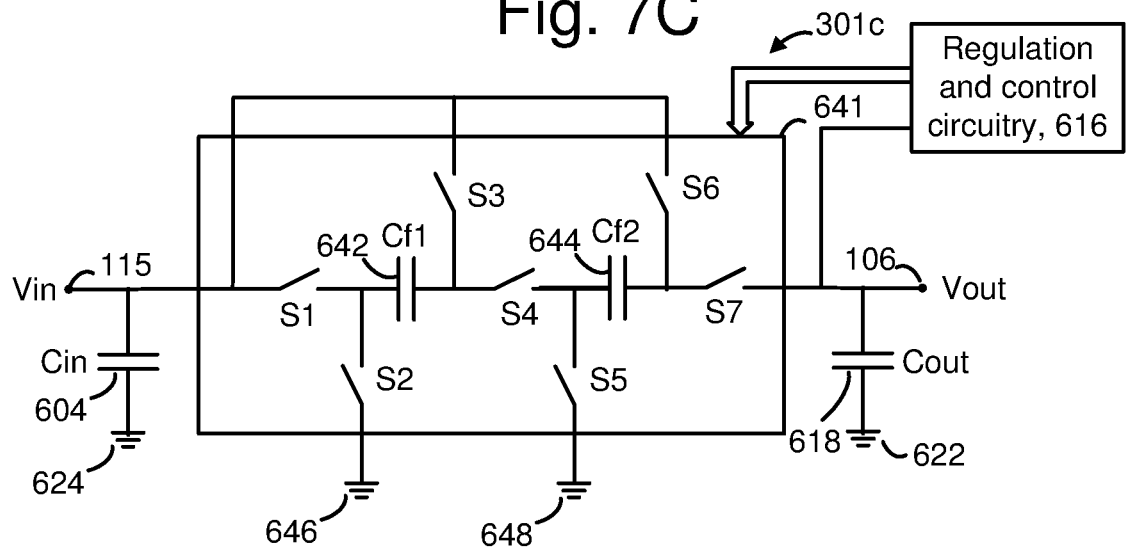
FIG. 7C depicts an example implementation of the charge pump 301 of FIG. 3A configured as a single-stage, multi-capacitor charge pump.

FIG. 7C depicts an example implementation of the charge pump 301 of FIG. 3A configured as a single-stage, multi-capacitor charge pump. In the charge pump 301c, multiple flying capacitors are provided in a single stage. While two capacitors are provided as an example, more than two may be used. There are many possible charge pump configurations with multiple flying capacitors. The charge pump 301c is configured as a voltage multiplier in which Vout≈3×Vin. Capacitors Cf1 642 and Cf2 644 are provided. A set of switches 641 includes switches S1 to S7. S2 and S5 are connected to ground nodes 646 and 648, respectively. During a charging phase, switches S2, S3, S5, and S6 are closed, while S1, S4 and S7 are open, so that both flying capacitors Cf1 and Cf2 are connected in parallel and charged to the input voltage. During a discharging phase, switches S1, S4 and S7 are closed, and S2, S3, S5 and S6 are open, so that the flying capacitors are connected in series between the input node 415 and the output node 406. This effectively creates an output voltage of approximately three times the input voltage.

The use of multiple flying capacitors in a single stage can provide a ratio between Vout and Vin, e.g., Vout=1.5×Vin, 3×Vin, etc., or Vout=½×Vin, ⅓×Vin, etc. For greater flexibility, a multi-stage charge pump, such as described below, can be used.

Figure 7D:
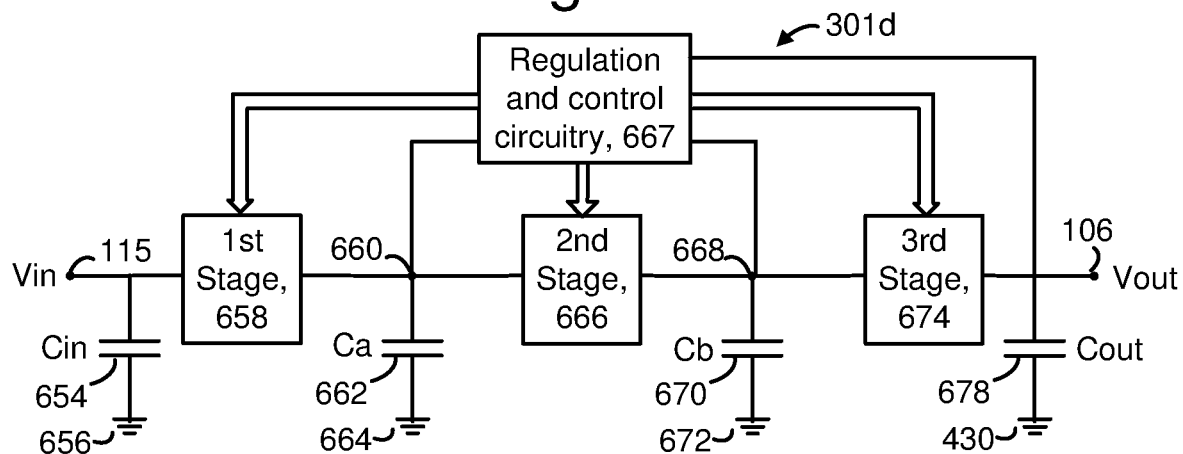
FIG. 7D depicts an example implementation of the charge pump 301 of FIG. 3A configured as a multi-stage charge pump.

FIG. 7D depicts an example implementation of the charge pump 301 of FIG. 3A configured as a multi-stage charge pump. Vin is provided at input node 415 so that Vout is obtained at an output node 406. As an example, three stages 658, 666 and 674 are provided. Two or more stages may be used in a multi-stage charge pump. Each stage can include switches and one or more flying capacitors as discussed previously, for example. At the input, a capacitor Cin 654 is connected at one of its conductive layers to a ground node 656. At a node 660 which is between the first stage 658 and the second stage 666, a capacitor Ca 662 is connected at one of its conductive layers to a ground node 664. At a node 668 which is between the second stage 666 and the third stage 674, a capacitor Cb 670 is connected at one of its conductive layers to a ground node 672. Finally, at the output node 406, an output capacitor Cout 678 is connected at one of its conductive layers to a ground node 430. A multi-stage charge pump can provide greater flexibility in terms of providing a greater range of output voltages. Further, each stage can include one or more capacitors to provide even greater flexibility.

The multi-stage charge pump 301d is operated under the control of regulation and control circuitry 667 which controls switching in each stage. Note that it is also possible to provide regulation and control circuitry in each stage, additionally or alternatively. Charge is transferred from the input node 415 of the first stage to a flying capacitor (not shown) in the first stage 658, and from the flying capacitor of the first stage to the node 660. Charge is then transferred from the node 660 of the second stage to a flying capacitor (not shown) in the second stage, and from the flying capacitor of the second stage to the node 668. Charge is then transferred from the node 668 to a flying capacitor (not shown) in the third stage, and from the flying capacitor of the third stage to the output node 406, assuming there are no further stages.

Figure 8A:
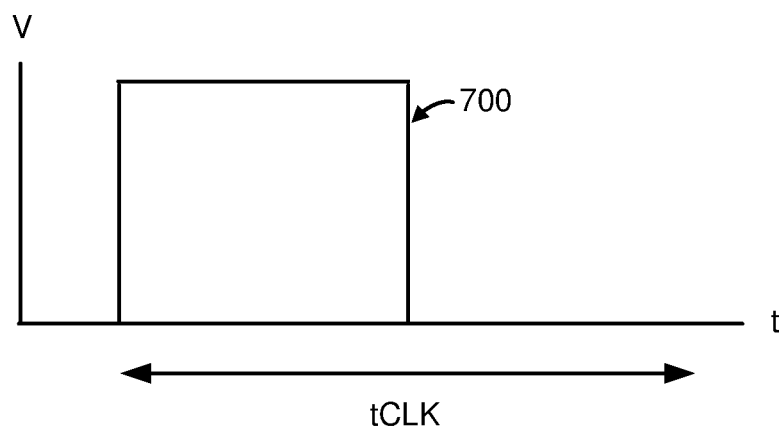
FIG. 8A depicts an example clock signal of a charge pump.

FIG. 8A depicts an example clock signal of a charge pump. A voltage of the signal is plotted versus time. As mentioned, regulation and control circuitry is used to provide switches in a charge pump with appropriate control signals, including frequency, phases, amplitudes, delays, etc., depending on the particular configuration. The control signals are set so that the one or more capacitors in the charge pump operate at desired operating points. Generally, the capacitor undergoes repeated cycles of charging and discharging in order to transfer charge from the input node to the output node. Thus, the applied voltage across the capacitor varies during charging and discharging. Note that Vin may be substantially constant during the charging and discharging.

The waveform 700 represents a clock pulse in a clock period tCLK, and includes a high level and a low level. These levels can be of equal or different durations. The duration of the clock pulse relative to tCLK is the duty cycle, as mentioned.

Figure 8B:
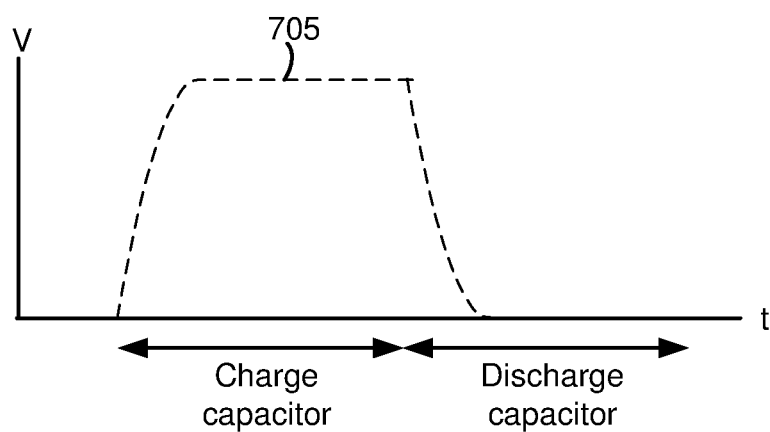
FIG. 8B depicts an example plot of a voltage of a flying capacitor in a charge pump during charging and discharging.

FIG. 8B depicts an example plot 705 of a voltage of a flying capacitor in a charge pump during charging and discharging. The voltage is plotted versus time and is time-aligned with the clock signal of FIG. 8A. The waveform 700 represent one clock period and includes a high level and a low level. In this example, charging of the capacitor occurs when the clock signal is high and discharging of the capacitor occurs when the clock signal is low.

Figure 9:
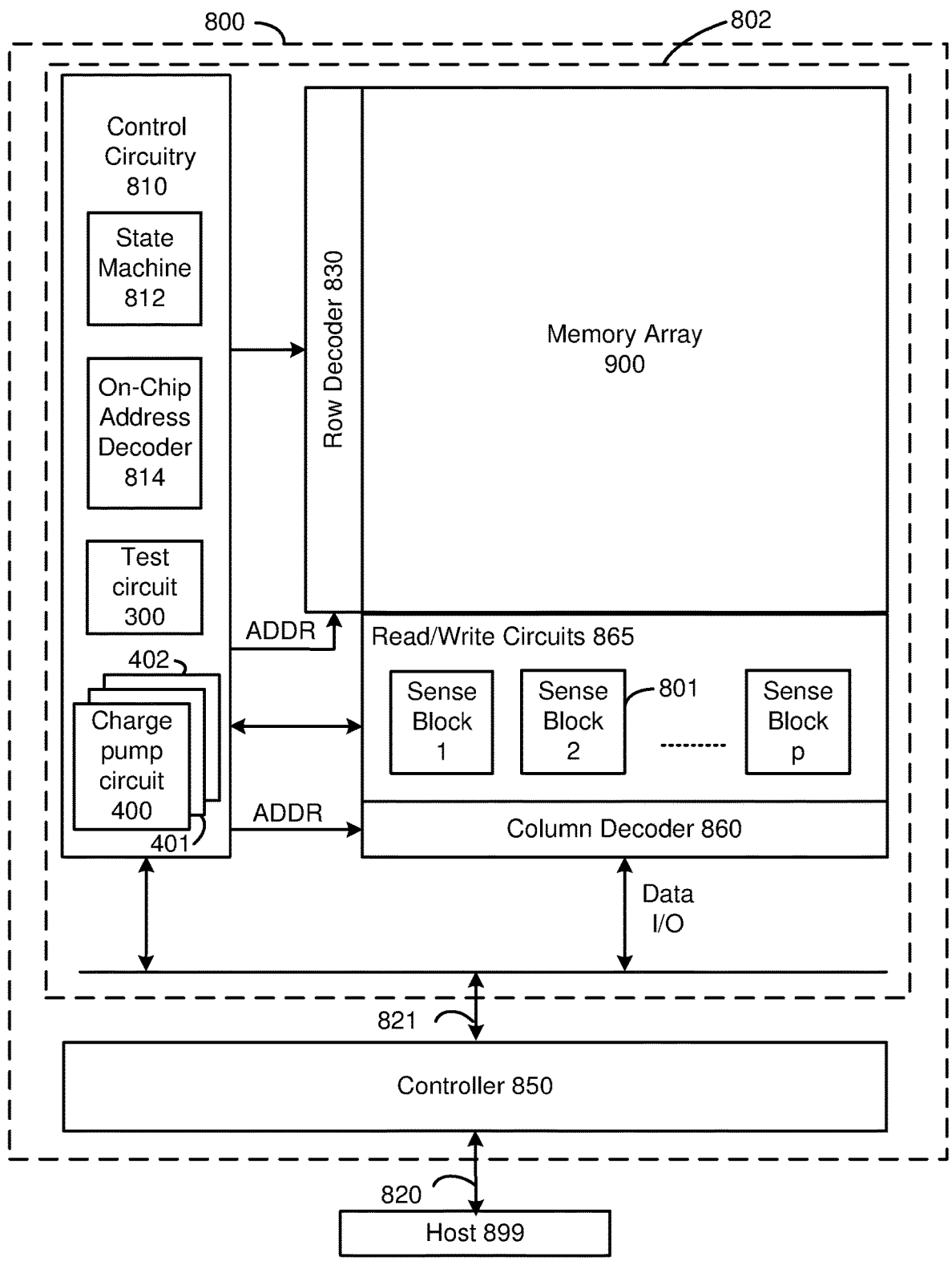
FIG. 9 is a block diagram of an example memory system including the test circuit 300 of FIG. 3A and the charge pump circuit 400 of FIG. 4.

FIG. 9 is a block diagram of an example memory system 800 including the test circuit 300 of FIG. 3A and the charge pump circuit 400 of FIG. 4. The memory system may include many blocks of storage elements. See, e.g., FIG. 10. The memory system 800 has read/write circuits for reading and programming a page of storage elements in parallel, and may include one or more memory die 802. Memory die 802 includes an array 900 of storage elements, which may include several of the blocks 901 of FIG. 10, control circuitry 810, and read/write circuits 865. In some embodiments, the array of storage elements can be three dimensional. The memory array is addressable by word lines via a row decoder 830 and by bit lines via a column decoder 860. The read/write circuits 865 include multiple sense blocks 801 and allow a page of storage elements to be read or programmed in parallel. Typically an off-chip controller 850 is included in the same memory device (e.g., a removable storage card) as the one or more memory die 802. Commands and data are transferred between the host 899 and controller 850 via lines 820 and between the controller and the one or more memory die 802 via lines 821.

The control circuitry 810 cooperates with the read/write circuits 865 to perform operations on the memory array. The control circuitry 810 includes a state machine 812, an on-chip address decoder 814, the test circuit 300 of FIG. 3A, the charge pump circuit 400 of FIG. 4 (which includes the charge pump A), and additional charge pump circuits 401 and 402 which include the charge pumps B and C, respectively.

The state machine 812 provides chip-level control of memory operations. For example, the state machine may be configured to test charge pumps as described herein. The state machine may also be configured to perform operations on the memory cells such as read and verify processes. The on-chip address decoder 814 provides an address (ADDR) interface between that used by the host or a memory controller to the hardware address used by the decoders 830 and 860. The charge pump circuits control the power and voltages supplied to the word lines and bit lines during memory operations.

In some implementations, some of the components of FIG. 9 can be combined. In various designs, one or more of the components (alone or in combination), other than memory array 900, can be thought of as a managing or control circuit. For example, one or more managing or control circuits may include any one of, or a combination of, control circuitry 810, state machine 812, decoders 814 and 860, charge pump circuit 100, sense blocks 801, read/write circuits 865, controller 850, host 899, and so forth.

The data stored in the memory array is read out by the column decoder 860 and output to external I/O lines via the data I/O line and a data input/output buffer. Program data to be stored in the memory array is input to the data input/output buffer via the external I/O lines. Command data for controlling the memory device are input to the controller 850. The command data informs the flash memory of what operation is requested. The input command is transferred to the control circuitry 810. The state machine 812 can output a status of the memory device such as READY/BUSY or PASS/FAIL. When the memory device is busy, it cannot receive new read or write commands.

In another possible configuration, a non-volatile memory system can use dual row/column decoders and read/write circuits. In this case, access to the memory array by the various peripheral circuits is implemented in a symmetric fashion, on opposite sides of the array, so that the densities of access lines and circuitry on each side are reduced by half.

Figure 10:
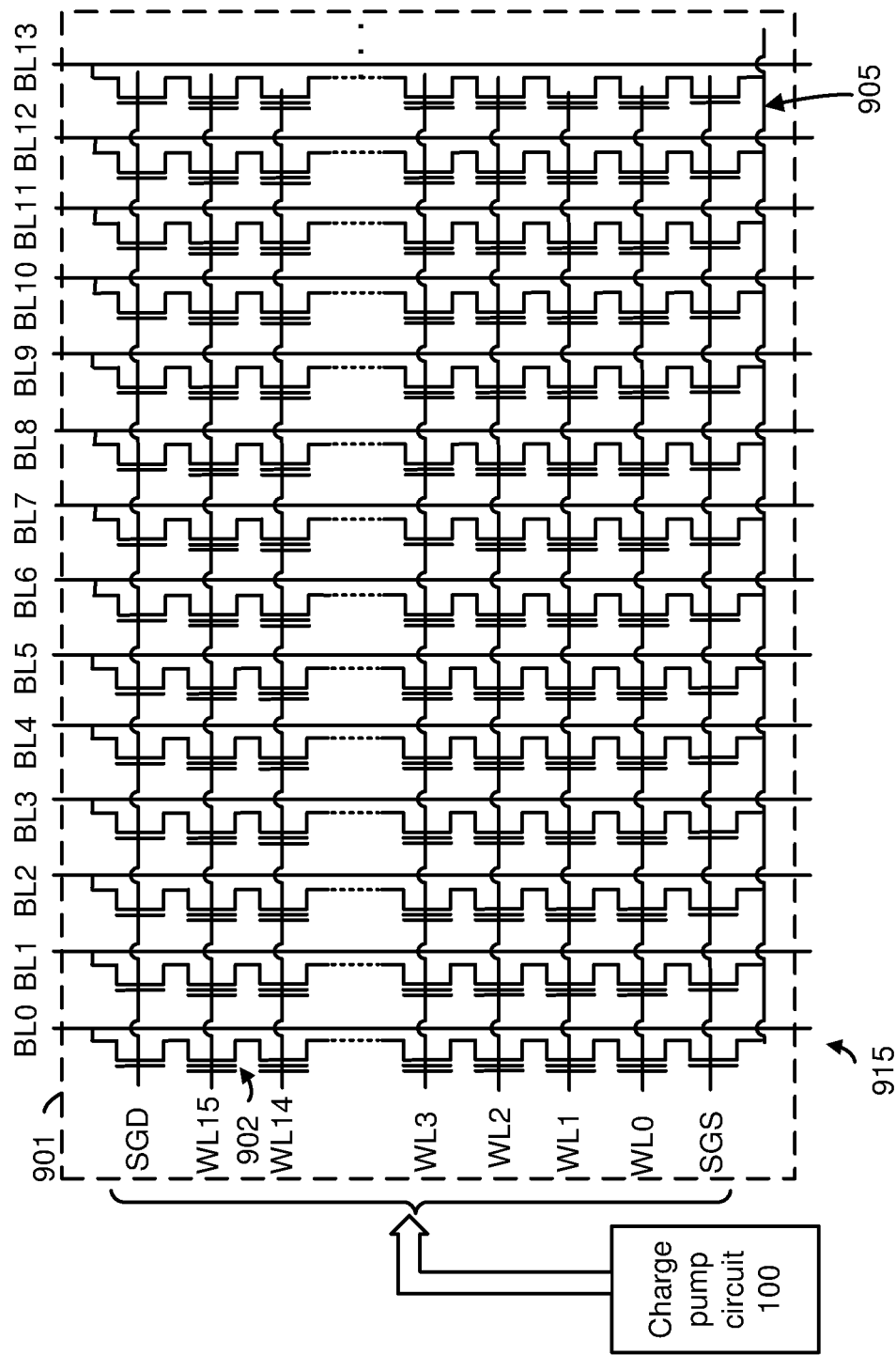
FIG. 10 depicts a block of memory cells in an example configuration of the memory array 900 of FIG. 9.

FIG. 10 depicts a block of memory cells in an example configuration of the memory array 900 of FIG. 9. The memory cells may represent a plurality of non-volatile memory cells. A charge pump provides an output voltage which is different from a supply or input voltage. In one example application, the charge pump circuit 100 is used to provide voltages at different levels during erase, program or read operations in a non-volatile memory device such as a NAND flash EEPROM. In such a device, a block 901 of memory cells includes a number of storage elements which communicate with respective word lines WL0-WL15, respective bit lines BL0-BL13, and a common source line 905. An example storage element 902 is depicted. In the example provided, sixteen storage elements are connected in series to form a NAND string (see example NAND string 915), and there are sixteen data word lines WL0 through WL15. Moreover, one terminal of each NAND string is connected to a corresponding bit line via a drain select gate (connected to select gate drain line SGD), and another terminal is connected to a common source 905 via a source select gate (connected to select gate source line SGS). Thus, the common source 905 is coupled to each NAND string. The block 901 is typically one of many such blocks in a memory array.

In an erase operation, a high voltage such as 20 V is applied to a substrate on which the NAND string is formed to remove charge from the storage elements. During a programming operation, a voltage in the range of 15-25 V is applied to a selected word line. In one approach, step-wise increasing program pulses are applied until a storage element is verified to have reached an intended state. Moreover, pass voltages at a lower level may be applied concurrently to the unselected word lines. In read and verify operations, the select gates (SGD and SGS) are connected to a voltage in a range of 2.5 to 4.5 V and the unselected word lines are raised to a read pass voltage, Vread, (typically a voltage in the range of 4.5 to 6 V) to make the transistors operate as pass gates. The selected word line is connected to a voltage, a level of which is specified for each read and verify operation, to determine whether a Vth of the concerned storage element is above or below such level.

In practice, the output of a charge pump may be used to provide different voltages concurrently to different word lines or groups of word lines. It is also possible to use multiple charge pumps to supply different word line voltages. Similarly, the output from a charge pump can be provided to a bit line or other location as needed in the memory system.

Accordingly, in one embodiment, an apparatus comprises: a comparator comprising a first input path and a second input path, the first input path is connected to a charge pump and the second input path is connected to the first input path; a first voltage divider and a delay circuit in the second input path; a counting circuit connected to an output path of the comparator and configured to count a number of transitions in the output path of the comparator during a test period; and a control circuit connected to the counting circuit and configured to receive the count from the counting circuit and compare the count to a maximum allowable number of transitions.

In another embodiment, a method comprises: comparing a first voltage signal on a first path to a second voltage signal on a second path in a test period, the second voltage signal comprises a delayed and divided down version of the first voltage signal, the first path is connected to a charge pump and the comparing detects a number of drop-offs in a voltage output of the charge pump while the charge pump is requested to output a fixed voltage; and based on the number of drop-offs, setting a pass/fail status for the charge pump.

In another embodiment, an apparatus comprises: a memory die comprising a plurality of non-volatile memory cells; a plurality of charge pumps on the memory die; a multiplexer on the memory die, the multiplexer is connected to the plurality of charge pumps;

a comparator on the memory die, the comparator comprising a first input path and a second input path, the first input path is connected to the multiplexer and the second input path is connected to the first input path, the second input path comprising a voltage divider and a delay circuit; and a control circuit, the control circuit is configured to select a charge pump of the plurality of the charge pumps, and to control the multiplexer to pass a voltage signal from the selected charge pump to the first input path.

The foregoing detailed description of the invention has been presented for purposes of illustration and description. It is not intended to be exhaustive or to limit the invention to the precise form disclosed. Many modifications and variations are possible in light of the above teaching. The described embodiments were chosen to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:
1. An apparatus, comprising:
  a comparator comprising a first input path and a second input path, the first input path is connected to a charge pump and the second input path is connected to the first input path;
  a first voltage divider and a delay circuit in the second input path;

a counting circuit connected to an output path of the comparator and configured to count a number of transitions in the output path of the comparator during a test period; and a control circuit connected to the counting circuit and configured to receive the count from the counting circuit and compare the count to a maximum allowable number of transitions.

2. The apparatus of claim 1, wherein:
a voltage signal in the second input path is a delayed and divided down version of a voltage signal in the first input path.

3. The apparatus of claim 1, wherein:
the control circuit is configured to provide a request to the charge pump to output a fixed voltage during the test period; and
each transition corresponds to a downward transition in a voltage on the first input path, where the downward transition is more than a guard band voltage set by the first voltage divider.

4. The apparatus of claim 1, further comprising:
a second voltage divider connected to the charge pump, the first input path is connected to the second voltage divider to receive a divided down version of a voltage signal output by the charge pump.

5. The apparatus of claim 4, wherein:
the first voltage divider receives the divided down version of the voltage signal output by the charge pump; and
the first voltage divider divides down the divided down version of the voltage signal output by the charge pump to provide a guard band voltage.

6. The apparatus of claim 1, wherein:
the first voltage divider is in a set of voltage dividers, the set of voltage dividers is configured to divide a voltage according to a plurality of ratios; and
the control circuit is configured to provide a signal to the set of voltage dividers selecting a ratio of the plurality of ratios.

7. The apparatus of claim 1, wherein:
the control circuit is configured to select the maximum allowable number of transitions from among a plurality of maximum allowable numbers of transitions.

8. The apparatus of claim 1, wherein:
the control circuit is configured to set a pass/fail status for the charge pump based on a comparison of the number of transitions in the output signal to a maximum allowable number of transitions.

9. The apparatus of claim 1, wherein:
the control circuit is configured to provide a signal to the delay circuit to select a delay among a plurality of delays.

10. The apparatus of claim 1, further comprising:
a multiplexer connected to output paths of a plurality of charge pumps, the control circuit is configured to provide a signal to the multiplexer selecting the charge pump from among a plurality of charge pumps.

11. The apparatus of claim 10, wherein:
the first voltage divider is configured to divide a voltage according to a plurality of ratios; and
the control circuit is configured to provide a signal to the first voltage divider selecting a ratio of the plurality of ratios, the ratio is based on the selected charge pump.

12. The apparatus of claim 10, wherein:
the control circuit is configured to select the maximum allowable number of transitions from among a plurality of maximum allowable numbers of transitions; and
the selected maximum allowable number of transitions is based on the selected charge pump.

13. A method, comprising:
at a control circuit, comparing a first voltage signal on a first path to a second voltage signal on a second path in a test period, the second voltage signal comprises a delayed and divided down version of the first voltage signal, the first path is connected to a charge pump and the comparing detects a number of drop-offs in a voltage output of the charge pump while the charge pump is requested to output a fixed voltage; and
based on the number of drop-offs, setting a pass/fail status for the charge pump.

14. The method of claim 13, wherein:
each drop-off comprises a decrease in a voltage of the voltage signal on the first path below a voltage of the voltage signal on the second path.

15. The method of claim 13, further comprising:
selecting the charge pump from among a plurality of charge pumps; and
determining a maximum allowable number of drop-offs based on the selected charge pump, wherein the pass/fail status is set by comparing a number of the drop-offs to the maximum allowable number of drop-offs.

16. An apparatus, comprising:
a memory die comprising a plurality of non-volatile memory cells;
a plurality of charge pumps on the memory die;
a multiplexer on the memory die, the multiplexer is connected to the plurality of charge pumps;
a comparator on the memory die, the comparator comprising a first input path and a second input path, the first input path is connected to the multiplexer and the second input path is connected to the first input path, the second input path comprising a voltage divider and a delay circuit; and
a control circuit, the control circuit is configured to select a charge pump of the plurality of the charge pumps, and to control the multiplexer to pass a voltage signal from the selected charge pump to the first input path.

17. The apparatus of claim 16, wherein:
the control circuit is configured to set a ratio of the voltage divider based on the selected charge pump.

18. The apparatus of claim 16, wherein:
in a test period in which the selected charge pump is requested to provide a voltage signal at a fixed level, the control circuit is configured to determine a number of times a voltage on the first input path falls below a voltage on the second input path and to compare the number to a maximum allowable number.

19. The apparatus of claim 18, wherein:
the control circuit is configured to select the maximum allowable number based on the selected charge pump.

20. The apparatus of claim 18, wherein:
the control circuit is configured to set a fail status for the selected charge pump when the number exceeds the maximum allowable number.

* * * * *